(12) United States Patent
Yang et al.

(10) Patent No.: US 12,114,424 B2
(45) Date of Patent: Oct. 8, 2024

(54) CIRCUIT BOARD AND PREPARATION METHOD THEREOF

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Mei Yang, Qinhuangdao (CN); Gang Yuan, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 391 days.

(21) Appl. No.: 17/639,323

(22) PCT Filed: Apr. 24, 2020

(86) PCT No.: PCT/CN2020/086769
§ 371 (c)(1),
(2) Date: Feb. 28, 2022

(87) PCT Pub. No.: WO2021/212490
PCT Pub. Date: Oct. 28, 2021

(65) Prior Publication Data
US 2022/0322530 A1    Oct. 6, 2022

(51) Int. Cl.
*H05K 1/11*     (2006.01)
*H03K 3/42*     (2006.01)
(Continued)

(52) U.S. Cl.
CPC ............. *H05K 1/115* (2013.01); *H05K 3/067* (2013.01); *H05K 3/423* (2013.01); *H05K 2201/09227* (2013.01); *H05K 2201/09563* (2013.01)

(58) Field of Classification Search
CPC .................... H05K 1/115; H05K 1/11; H05K 2201/09227; H05K 2201/09563;
(Continued)

(56) References Cited

U.S. PATENT DOCUMENTS

| | | | |
|---|---|---|---|
| 5,296,649 A | 3/1994 | Kosuga et al. | |
| 2006/0016553 A1* | 1/2006 | Watanabe | H05K 3/205 156/272.2 |

(Continued)

FOREIGN PATENT DOCUMENTS

| | | |
|---|---|---|
| CN | 1065372 A | 10/1992 |
| CN | 103747623 A | 4/2014 |
| CN | 108668454 A | 10/2018 |

*Primary Examiner* — Timothy J Thompson
*Assistant Examiner* — Guillermo J Egoavil
(74) *Attorney, Agent, or Firm* — ScienBiziP, P.C.

(57) ABSTRACT

A circuit board and a manufacturing method therefor. The circuit board includes a substrate and a plurality of traces arranged at intervals on the substrate. Each trace includes a seed layer located on one surface of the substrate, a first copper layer located on the surface of the seed layer away from the substrate, and a second copper layer plated on one surface of the substrate. The second copper layer covers the seed layer and the first copper layer. The ratio of the thickness of each trace to the space between any two adjacent traces is greater than 1. The thickness of the second copper layer in the thickness direction of the substrate is greater than the thickness of the second copper layer in a direction perpendicular to the thickness direction of the substrate.

16 Claims, 8 Drawing Sheets

(51) Int. Cl.
*H05K 3/06* (2006.01)
*H05K 3/42* (2006.01)

(58) Field of Classification Search
CPC .......... H05K 3/067; H05K 3/423; H05K 3/06;
H05K 3/42; H05K 1/0298; H01L
21/4857; H01L 21/486; H01L 23/49827;
H01L 23/49838; H01L 23/49822; H01L
24/16; H01L 2224/16227
USPC .......................................... 174/262; 361/748
See application file for complete search history.

(56) References Cited

U.S. PATENT DOCUMENTS

2010/0258931 A1* 10/2010 Yoshida .............. H01L 25/0657
257/692
2018/0366404 A1* 12/2018 Pun ........................ H01L 25/16
2020/0168541 A1* 5/2020 Tanaka ................. H05K 1/0298

\* cited by examiner

CIRCUIT BOARD AND PREPARATION METHOD THEREOF

FIELD

The subject matter herein generally relates to circuit boards, specifically to a circuit board and a preparation method of the circuit board.

BACKGROUND

Generally, an additive process is used for making thick copper traces with a fine pitch on circuit boards. However, during the process of the additive method, a height of the copper layer cannot exceed a height of the dry film. If the height of the copper layer exceeds the dry film, a mushroom head shape will develop, making the dry film difficult to remove. Therefore, in the additive method of preparing the circuit board, the height and pitch of the copper layer are limited by the thickness and the resolution ability of the dry film.

Therefore, there is room for improvement in the art.

BRIEF DESCRIPTION OF THE DRAWINGS

Implementations of the present disclosure will now be described, by way of embodiment, with reference to the attached figures.

The following specific embodiments will further illustrate the present disclosure in conjunction with the above drawings.

DETAILED DESCRIPTION

In the following, the technical solutions of the embodiments of the present disclosure will be clearly and completely described in conjunction with the accompanying drawings of the embodiments of the present invention. Obviously, the described embodiments are only a part of embodiments, but not all embodiments. Based on the embodiments of the present disclosure, all other embodiments obtained by those of ordinary skill in the art without creative efforts shall fall within the protection scope of the present disclosure.

Unless otherwise defined, all technical and scientific terms used herein have the same meaning as commonly understood by those skilled in the technical field of the present disclosure. The terms used in the description of the present disclosure herein are only for the purpose of describing specific embodiments, and are not intended to limit the present disclosure.

Some embodiments of the present disclosure will be described in detail below with reference to the accompanying drawings. The embodiments described below and features in the embodiments may be combined with each other without conflict.

Figure 1:
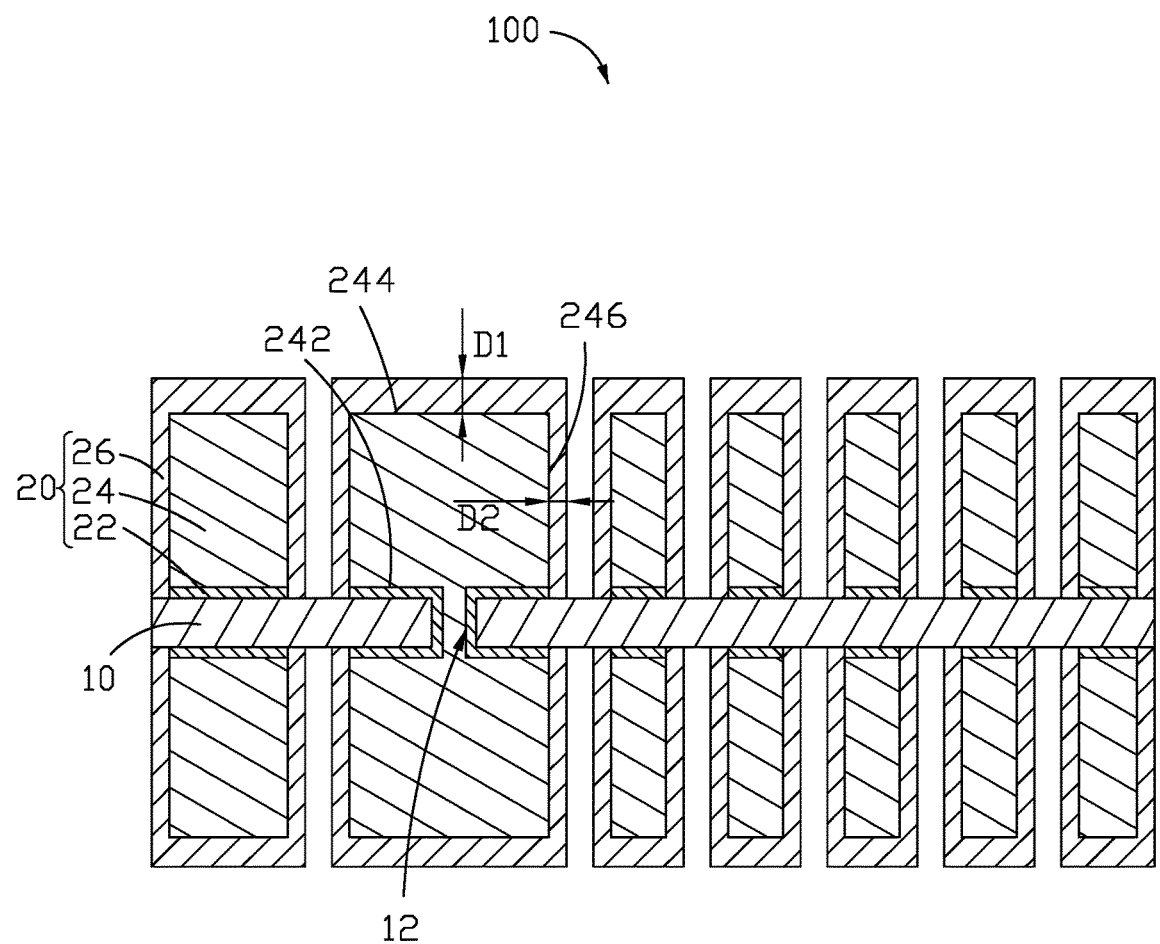
FIG. 1 is a schematic cross-sectional view of a circuit board according to an embodiment of the present disclosure.

FIG. 1 is a schematic cross-sectional view of a circuit board 100 according to an embodiment of the present disclosure. As shown in FIG. 1, the circuit board 100 includes a substrate 10 and a plurality of traces 20 spaced apart from each other on the substrate 10. Each trace 20 includes a seed layer 22, a first copper layer 24 and a second copper layer 26.

The seed layer 22 is located on a surface of the substrate 10. The first copper layer 24 is located on a surface of the seed layer 22 away from the substrate 10. The second copper layer 26 is located on a surface of the substrate 10 and encloses the seed layer 22 and the first copper layer 24.

In one embodiment, the second copper layer 26 is formed on the substrate 10 by electroplating. Since the second copper layer 26 formed by electroplating has anisotropic growth, a height of the second copper layer 26 is to a certain extent greater than a width of the second copper layer 26. The fine pitch capability of the traces 20 but with an increased thickness of deposition of copper in the layer 26 is not completely determined by a thickness of the dry film and a resolution capability of the dry film. A ratio of a thickness of each trace 20 to a pitch between any two adjacent traces 20 is greater than 1, so that the thickness of each trace is increased, and the pitch between adjacent traces can be reduced.

As shown in FIG. 1, the first copper layer 24 completely covers the surface of the seed layer 22 away from the substrate 10. The second copper layer 26 encloses the surface of the seed layer 22 that is not covered by the substrate 10 and the first copper layer 24. The second copper layer 26 further encloses all surfaces of the first copper layer 24 which are not covered by the seed layer 22.

In one embodiment, the first copper layer 24 includes a lower surface 242 in direct contact with the seed layer 22, an upper surface 244 opposite to the lower surface 242, and a side surface 246 connecting the lower surface 242 and the upper surface 244. A thickness of the second copper layer 26 above the upper surface 244 of the first copper layer 24 (i.e., a height of the upper surface 244 of the first copper layer 24 from an upper surface of the second copper layer 26) is defined as a first thickness D1. A thickness of the second copper layer 26 covering the side surface 246 of the first copper layer 24 (i.e., a width from the side surface 246 of the first copper layer 24 to a side surface of the second copper layer 26) is defined as a second thickness D2. The first thickness D1 is at least twice as thick as the second thickness D2.

In one embodiment, by adjusting a type of additive and an acid-to-copper ratio (i.e., a ratio of copper sulfate and sulfuric acid) of an electroplating solution for electroplating the second copper layer 26, the second copper layer 26 mostly nucleates and grows along a vertical lattice of the first copper layer 24, the ratio of first thickness D1 to second thickness D2 can thus be adjusted. For example, the first thickness D1 may be made three, four, or five times thicker than the second thickness D2, etc., which can be customized according to design of the circuit board 100.

In one embodiment, the traces 20 formed on one surface of the substrate 10 are electrically connected to the traces 20 formed on the other surface of the substrate 10 through vias 12 formed in the substrate 10. Each via 12 can be formed by filling a through hole 14 with the seed layer 22 and the first copper layer 24.

In one embodiment, a material of the substrate 10 may be selected from one of polyethylene terephthalate, polyethylene naphthalate, polyimide, liquid crystal polymer and polyamide resin.

In one embodiment, a material of the seed layer 22 is a transition metal such as nickel-chromium alloy, nickel-copper alloy, or pure copper, which allows good adhesion with the first copper layer 24.

In one embodiment, a width of each trace 20 is 30 μm, the pitch between adjacent traces 20 is 15 μm, and the thickness of each trace 20 is 60 μm. That is, the thickness of each trace 20 is four times larger than the pitch between adjacent traces 20. Thus, thicker traces with a finer pitch is realized.

Figure 2:
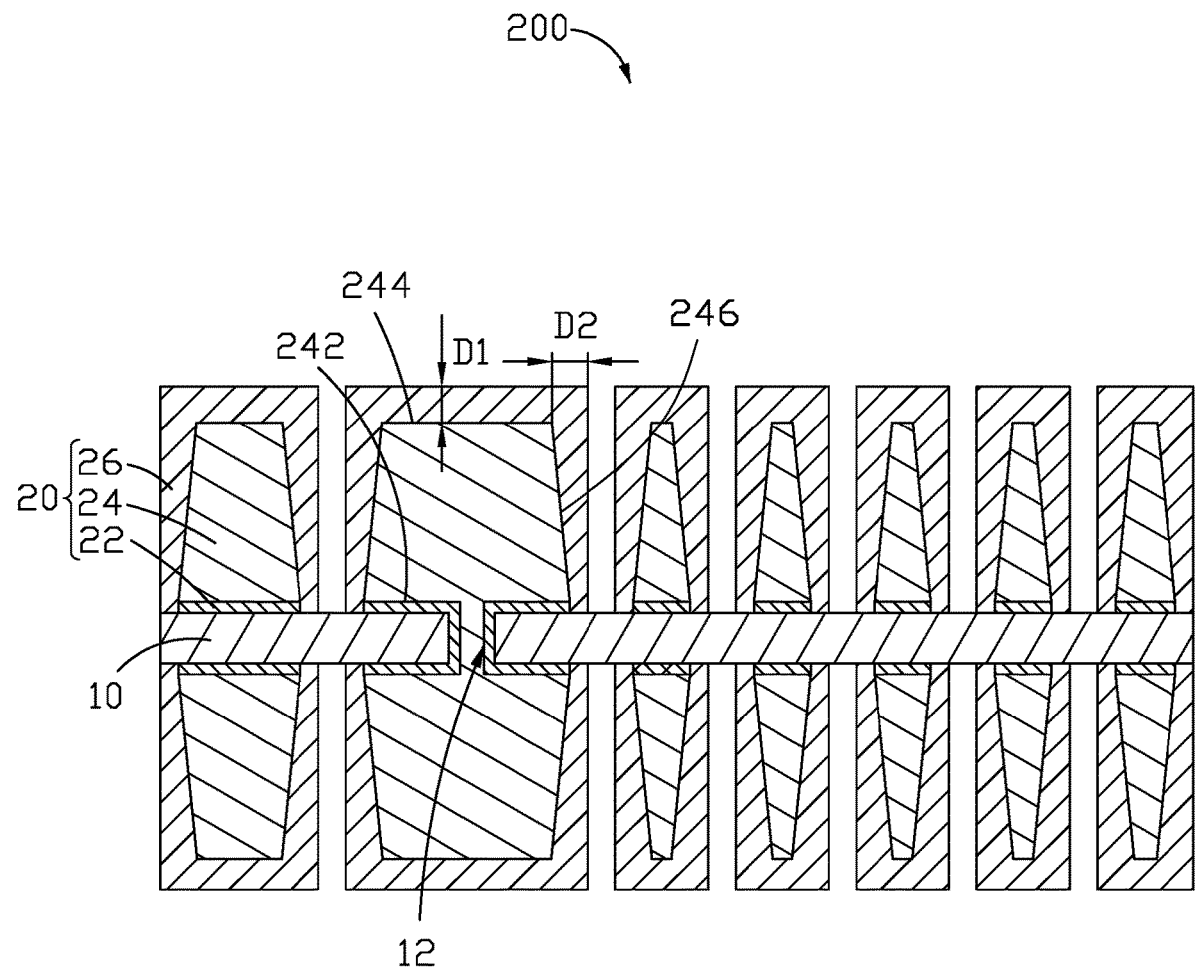
FIG. 2 is a schematic cross-sectional view of a circuit board according to another embodiment of the present disclosure.

FIG. 2 is a schematic cross-sectional view of a circuit board 200 according to another embodiment of the present disclosure. As shown in FIG. 1 and FIG. 2, the difference between the circuit board 200 and the circuit board 100 is that in the circuit board 200, a cross-section of the first copper layer 24 is a regular trapezoid along the thickness direction of the substrate 10, and the second thickness D2 gradually increases along the thickness direction of the substrate 10. That is, along the thickness direction of the substrate 10, the first copper layer 24 is trapezoidal in cross section, with a narrow top and a wide bottom. Closer to the substrate 10, the second thickness D2 of the second copper layer 26 is relatively small, the second thickness D2 of the second copper layer 26 gradually increases moving up from the substrate 10.

In one embodiment, the second thickness D2 at the upper surface 244 of the first copper layer 24 is equivalent to the first thickness D1. The second thickness D2 close to the lower surface 242 of the first copper layer 24 is less than the second thickness D2 close to the upper surface 244 of the first copper layer 24.

In one embodiment, in the circuit board 200, along the thickness direction of the substrate 10, the cross-section of each trace 20 is a trapezoid with a narrow top and a wide bottom, or it can be a rectangle with sizes which are roughly equal top and bottom.

Figure 3:
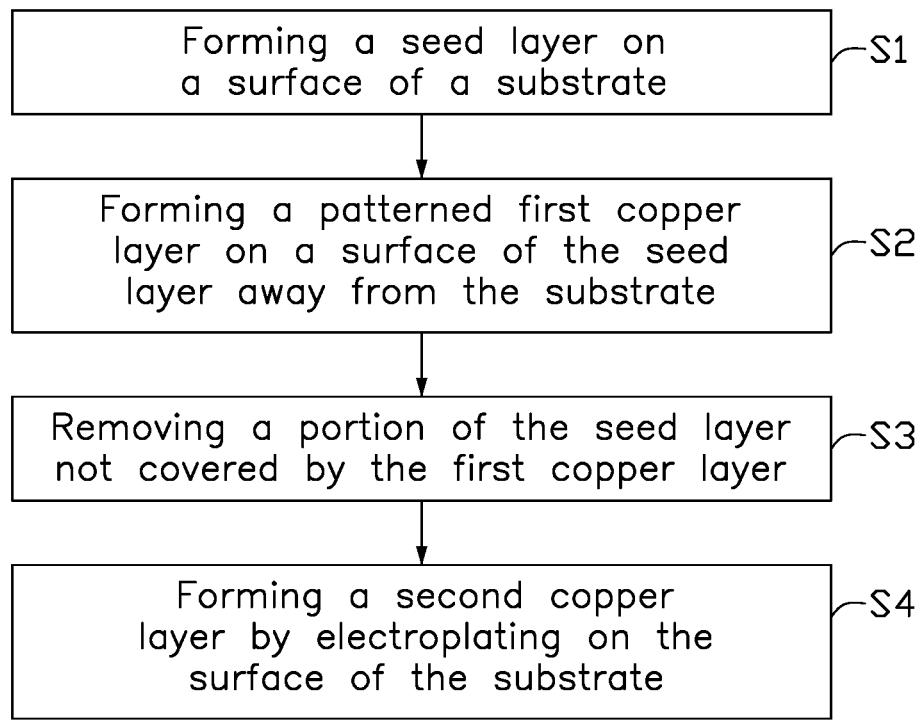
FIG. 3 is a schematic flowchart of a method of making a circuit board according to an embodiment of the present disclosure.

As shown in FIG. 3, an embodiment of the present disclosure further provides a preparation method of the circuit board 100 and the circuit board 200, which includes the following steps.

In block S1, a seed layer 22 is formed on a surface of a substrate 10.

Figure 4:
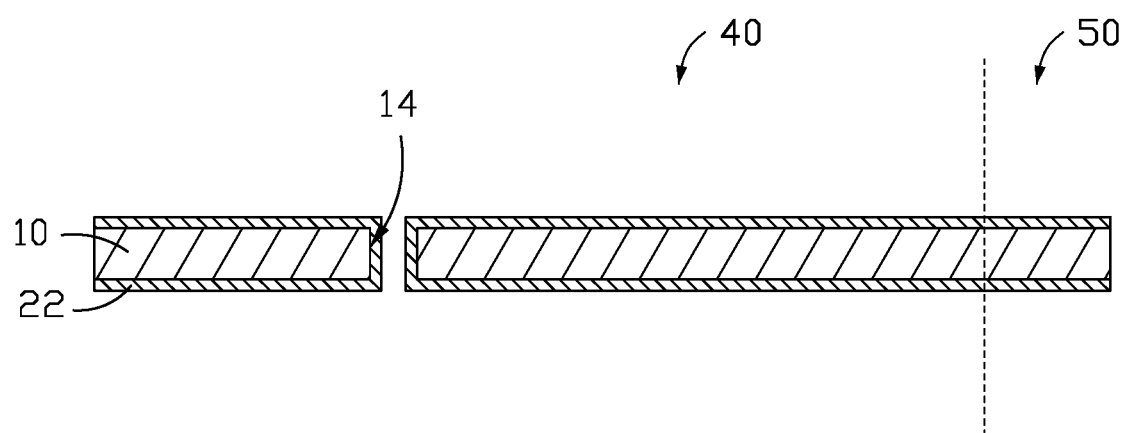
FIG. 4 is a schematic view showing step S1 of the flowchart in FIG. 3.

As shown in FIG. 4, the substrate 10 includes a product area 40 and a lead area 50. In the subsequent steps, a plurality of traces 20 is formed in the product area 40, and a plurality of conductive leads 52 is formed in the lead area 50. In the step of electroplating the second copper layer 26, the conductive leads 52 are connected to copper layers on an edge of the substrate 10. Moreover, in the subsequent steps, a stacked structure of the traces 20 formed in the product area 40 is exactly the same as a stacked structure of the conductive leads 52 formed in the lead area 50.

In one embodiment, as shown in FIG. 4, in block S1, a through hole 14 is formed on the substrate 10, and the seed layer 22 is formed on opposite surfaces of the substrate 10 and inner walls of the through hole 14. The seed layer 22 can be formed by electroless plating or sputtering. The through hole 14 is formed in the product area 40. The seed layer 22 is formed in the product area 40 and the lead area 50.

In block S2, a patterned first copper layer 24 is formed on a surface of the seed layer 22 away from the substrate 10.

Figure 5:
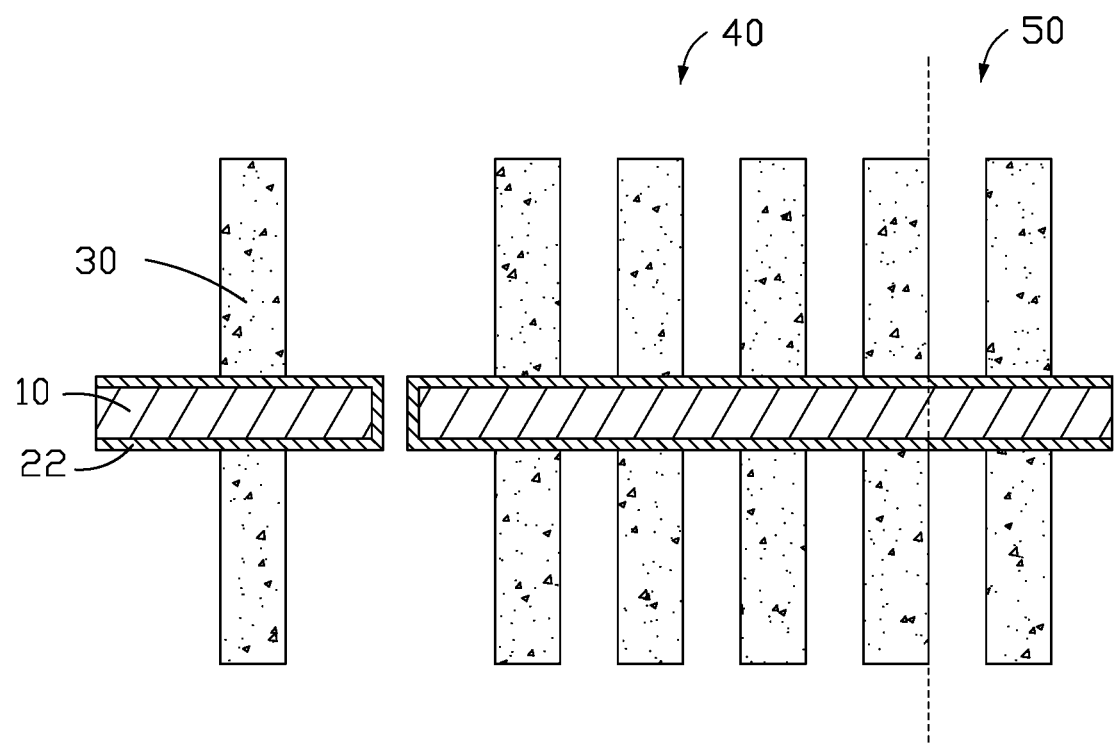
FIG. 5 is a schematic view showing a patterned dry film formed on a surface of a seed layer away from a substrate in step S2 of the flowchart in FIG. 3.

As shown in FIG. 5, a patterned dry film 30 is formed on the surface of the seed layer 22 away from the substrate 10. The patterned dry film 30 is located in part in the product area 40 and in part in the lead area 50.

Figure 6:
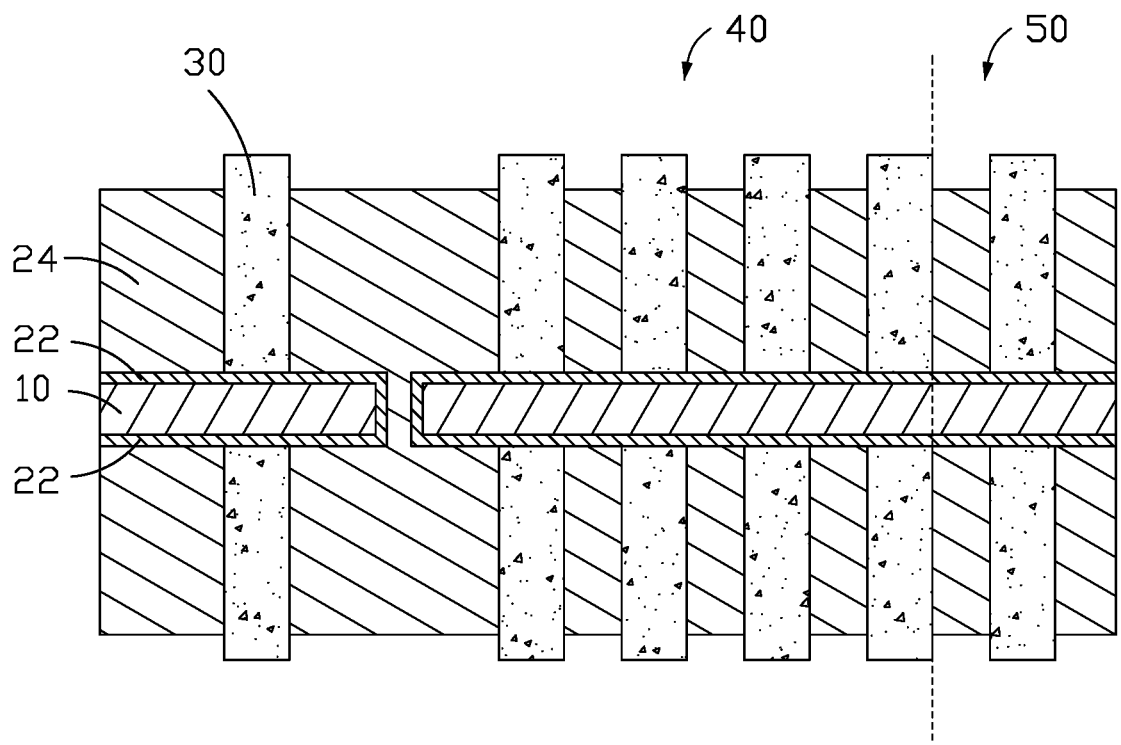
FIG. 6 is a schematic view showing a patterned first copper layer formed on a portion of the seed layer not covered by the patterned dry film in step S2 of the flowchart in FIG. 3.

As shown in FIG. 6, the patterned first copper layer 24 is formed on a portion of the seed layer 22 not covered by the patterned dry film 30. The patterned first copper layer 24 is located in part in the product area 40 and in part in the lead area 50.

In one embodiment, after forming the patterned first copper layer 24 in block S2, the method further includes removing the patterned dry film 30.

In block S3, a portion of the seed layer 22 not covered by the patterned first copper layer 24 is removed.

Figure 7:
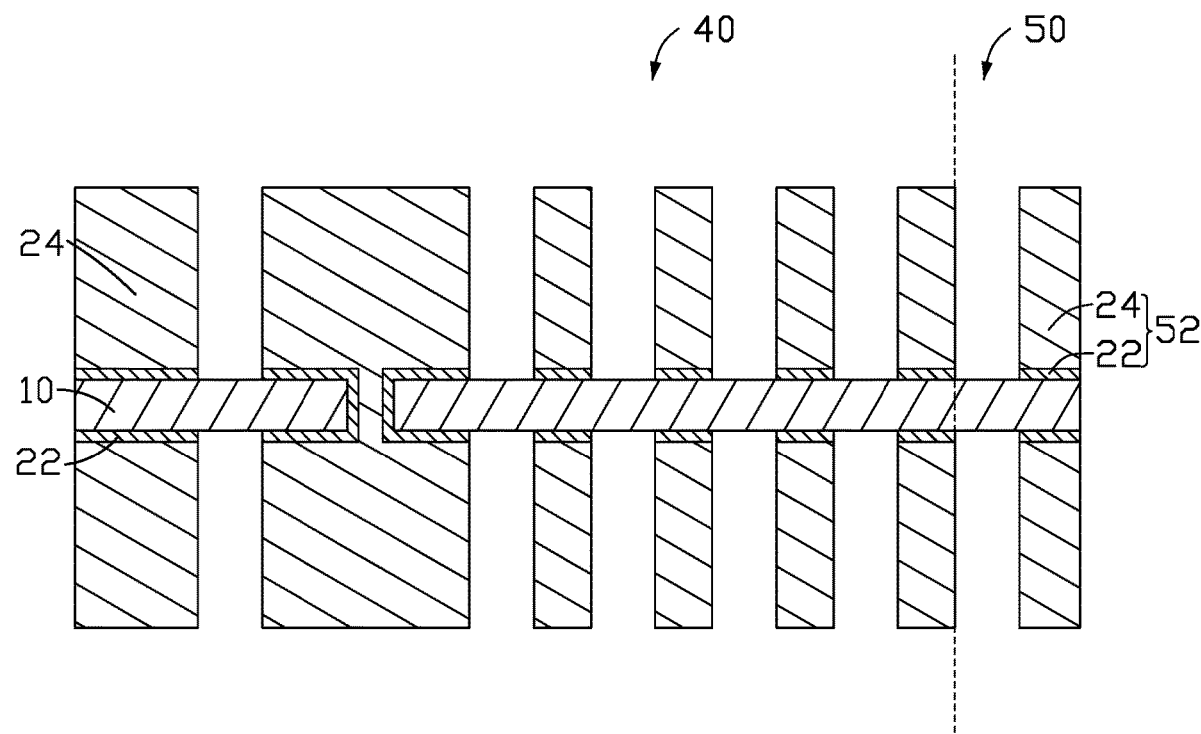
FIG. 7 is a schematic view showing step S3 of the flowchart in FIG. 3.

As shown in FIG. 7, the patterned dry film 30 is removed, and the portion of the seed layer 22 not covered by the patterned first copper layer 24 is removed by etching. After block S3, each conductive lead 52 includes an unetched portion of the seed layer 22 in the lead area 50 and the patterned first copper layer 24 covering the seed layer 22.

In another embodiment, after the seed layer 22 is removed in block S3, the method of forming the circuit board 200 shown in FIG. 2 further includes adjusting a spray pressure and a circulation rate of an etching solution. By reducing the spray pressure and slowing down the circulation rate of the etching solution, a regular trapezoidal patterned first copper layer 24 is obtained. When the seed layer 22 is rapidly micro-etched, the spray pressure of the etching solution is small and the circulation rate is slow, and the circulation rate of the etching solution at the bottom of the first copper layer 24 is less than the circulation rate of the etching solution at the top of the first copper layer 24. Thus the amount of etching done at the bottom of the first copper layer 24 is less than that done at the top of the first copper layer 24, and then a regular trapezoidal patterned first copper layer 24 is formed. The method avoids a deficiency of the top of the second copper layer 26 growing too fast, and reduces the occurrence of short circuits on the top of the second copper layer 26.

In block S4, the second copper layer 26 is formed by electroplating on the surface of the substrate 10 by the conductive leads 52.

Figure 8:
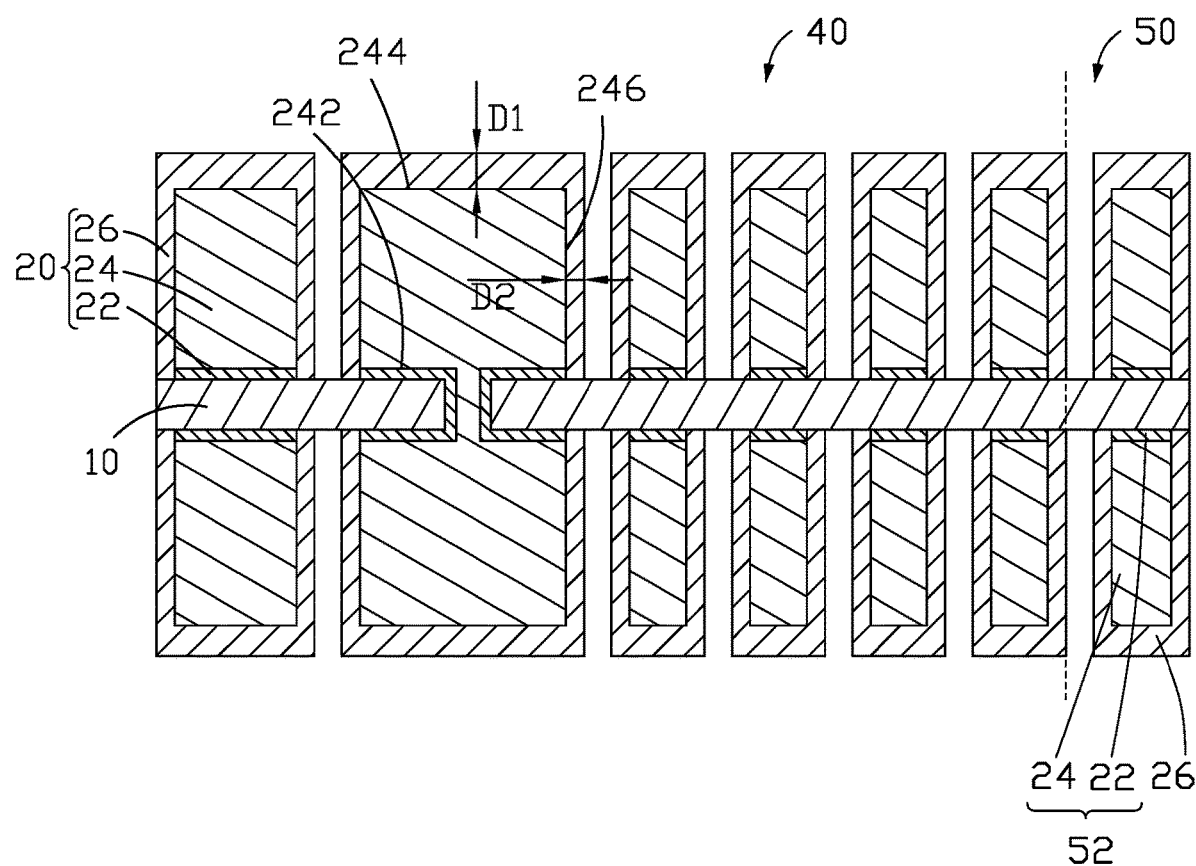
FIG. 8 is a schematic view showing step S4 of the flowchart in FIG. 3.

As shown in FIG. 8, in the product area 40, the second copper layer 26 encloses the seed layer 22 and the patterned first copper layer 24 to form the plurality of traces 20 spaced apart from each other. Each of the traces 20 includes the seed layer 22, the first copper layer 24 and the second copper layer 26. The ratio of the thickness of each trace 20 to the pitch between adjacent traces 20 is greater than 1. In the lead area 50, the second copper layer 26 encloses the conductive leads 52.

In block S4, the growth of the second copper layer 26 is anisotropic by adjusting the acid-to-copper ratio (the ratio of copper sulfate and sulfuric acid) and the type of additives in the electroplating solution for electroplating the second copper layer 26. The thickness of the second copper layer 26 along the thickness direction of the substrate 10 is at least equal to twice the thickness of the second copper layer 26 perpendicular to the thickness direction of the substrate 10.

In one embodiment, by adjusting the acid-to-copper ratio (the ratio of copper sulfate and sulfuric acid) and the type of additives in the electroplating solution for electroplating the second copper layer 26, the thickness of the second copper layer 26 along the thickness direction of the substrate 10 is three or more times greater than the thickness of the second copper layer 26 perpendicular to the thickness direction of the substrate 10, which can be customized according to the design of the circuit board 100.

In one embodiment, the electroplating solution is preferably a high-acid and low-copper solution, and the additive is selected from a group consisting of brightener, inhibitor, and leveling agent. The brightener reduces polarization, promotes copper deposition, and refines crystal grains. The inhibitor increases cathodic polarization, reduces surface tension, and assists action of the brightener. The leveling agent inhibits copper deposition in high current density areas. By adjusting the type and content of the additives, permeability of the electroplating solution can be weakened during the electroplating of the second copper layer 26, and function of the electroplating solution can be weakened in a narrow space. Additionally, due to tip effect of electric field distribution of copper electroplating, electric field lines at the top of the copper layer are more densely distributed, so that copper grows more at the top of the first copper layer, while the growth of copper is less at a narrow spacing between adjacent first copper layer, making the growth of copper grains directional. That is, the copper crystal grains are nucleated and are grown along the vertical lattice of the first copper layer 24 as much as possible, ensuring that a grown height of the second copper layer 26 is greater than a grown width of the second copper layer 26, thereby realizing thick copper and fine pitch of the traces.

In one embodiment, in block S4, after the second copper layer 26 is formed, the conductive leads 52 and the second copper layer 26 covering the conductive leads 52 are removed. In addition, the conductive leads 52 and the second copper layer 26 covering the conductive leads 52 can be removed after subsequent processes are completed.

In another embodiment, when the circuit board 200 shown in FIG. 2 is formed, the patterned first copper layer 24 has a regular trapezoid shape. In block S4, due to activity of the solution around the top of the first copper layer 24 and a concentrated electric field, the second thickness D2 at the upper surface 244 of the first copper layer 24 is equivalent to the first thickness D1. In addition, due to less activity of the solution around the bottom of the first copper layer 24, the second thickness D2 close to the lower surface 242 of the first copper layer 24 is much less than the second thickness D2 close to the upper surface 244 of the first copper layer 24. That is, a horizontal growth at the top of the second copper layer 26 is faster than horizontal growth at the bottom of the second copper layer 26. In addition, since the first copper layer 24 has a regular trapezoid shape after rapid micro-etching, it largely compensates for the top of the second copper layer 26 growing too fast, thereby avoiding sufficient proximity for short circuiting between the traces 20 caused by a too rapid growth of the top of the second copper layer 26.

In the circuit board and the preparation method of the circuit board, the second copper layer enclosing the seed layer and the first copper layer is formed by electroplating with conductive leads, without dry film, so that the thick copper and fine pitch capabilities of the traces are not completely determined by the thickness and resolution of the dry film. Adjustment of the acid-to-copper ratio of the electroplating solution and the content and proportion of additives, allows the second copper layer formed by electroplating to have anisotropic growth. To a certain extent, the height of the second copper layer as grown is greater than the width of the second copper layer as grown. The anisotropic growth of the second copper layer makes it possible to fabricate lines with thicker and finer pitches, and realizes thickening of the lines and the narrowing of the pitches.

The above embodiments are only used to illustrate the technical solutions of the present disclosure and not to limit them. Although the present disclosure has been described in detail with reference to the preferred embodiments, those of ordinary skill in the art should understand that the technical solutions of the present disclosure can be modified or equivalently replaced without departing from the spirit and scope of the technical solutions of the present disclosure.

What is claimed is:

1. A circuit board, comprising:
   a substrate; and
   a plurality of traces spaced apart from each other on the substrate, wherein each of the plurality of traces comprises:
   a seed layer on a surface of the substrate;
   a first copper layer on a surface of the seed layer away from the substrate; and
   a second copper layer formed on the surface of the substrate by electroplating, and the second copper layer enclosing the seed layer and the first copper layer;
   wherein a ratio of a thickness of each of the plurality of traces to a pitch between any two adjacent ones of the plurality of traces is greater than 1; the first copper layer comprises a lower surface in direct contact with the seed layer, an upper surface opposite to the lower surface, and a side surface connecting the lower surface and the upper surface;
   a thickness of the second copper layer covering the upper surface of the first copper layer is defined as a first thickness, and a thickness of the second copper layer covering the side surface of the first copper layer is defined as a second thickness; and
   the first thickness is greater than the second thickness;
   wherein the first thickness is at least twice as thick as the second thickness.

2. The circuit board of claim 1, wherein the first copper layer completely covers the surface of the seed layer away from the substrate;
   the second copper layer encloses the surface of the seed layer that is not covered by the substrate and the first copper layer, and the second copper layer further encloses all surfaces of the first copper layer that are not covered by the seed layer.

3. The circuit board of claim 1, wherein a cross section of the first copper layer is a rectangle along a thickness direction of the substrate.

4. The circuit board of claim 1, wherein a cross section of the first copper layer is a regular trapezoid along a thickness direction of the substrate, and the second thickness gradually increases along the thickness direction of the substrate.

5. A preparation method of a circuit board, comprising:
   forming a seed layer on a surface of a substrate;
   forming a dry film which is patterned on a surface of the seed layer away from the substrate;
   forming a first copper layer which is patterned on a portion of the seed layer not covered by the dry film;
   removing the dry film and removing a portion of the seed layer not covered by the first copper layer; and
   forming a second copper layer by electroplating on the surface of the substrate through a conductive lead;
   wherein forming the second copper layer comprises adjusting an acid-to-copper ratio of an electroplating solution suitable for electroplating the second copper layer, a type of additives in the electroplating solution, and a content of additives in the electroplating solution as required, so that copper crystal grains nucleate and grow along a vertical lattice of the first copper layer as much as possible, and a thickness of the second copper layer along a thickness direction of the substrate is greater than a thickness of the second copper layer along a direction perpendicular to the thickness direction of the substrate;

the second copper layer encloses the seed layer and the first copper layer to form a plurality of traces spaced apart from each other, each of the plurality of traces comprises the seed layer, the first copper layer and the second copper layer, and a ratio of a thickness of each of the plurality of traces to a pitch between any two adjacent ones of the plurality of traces is greater than 1.

6. The preparation method of the circuit board of claim 5, wherein by adjusting the acid-to-copper ratio of the electroplating solution and the type of additives in the electroplating solution for electroplating the second copper layer, the thickness of the second copper layer along the thickness direction of the substrate is at least twice as thick as the thickness of the second copper layer along the direction perpendicular to the thickness direction of the substrate.

7. The preparation method of the circuit board of claim 5, wherein the additive is selected from a group consisting of brightener, inhibitor, and leveling agent.

8. The preparation method of the circuit board of claim 5, wherein forming the seed layer on the surface of the substrate comprises forming a through hole on the substrate, and forming the seed layer on two opposite surfaces of the substrate and an inner wall of the through hole.

9. The preparation method of the circuit board of claim 5, wherein removing the portion of the seed layer not covered by the first copper layer comprises adjusting a spray pressure and a circulation rate of an etching solution, so that a cross section of the first copper layer is a rectangle in the thickness direction of the substrate.

10. The preparation method of the circuit board of claim 5, wherein removing the portion of the seed layer not covered by the first copper layer comprises adjusting a spray pressure and a circulation rate of an etching solution, so that a cross section of the first copper layer is a regular trapezoid in the thickness direction of the substrate.

11. The preparation method of the circuit board of claim 8, wherein forming the seed layer by chemical plating or sputtering.

12. The circuit board of claim 1, wherein a material of the substrate is selected from one of polyethylene terephthalate, polyethylene naphthalate, polyimide, liquid crystal polymer and polyamide resin.

13. The circuit board of claim 1, wherein a material of the seed layer is a transition metal selected from one of nickel-chromium alloy, nickel-copper alloy, and pure copper.

14. The circuit board of claim 1, wherein the thickness of each of the plurality of traces is four times the pitch between any two adjacent ones of the plurality of traces.

15. The circuit board of claim 14, wherein the pitch between any two adjacent ones of the plurality of traces is 15 μm, and the thickness of each of the plurality of traces is 60 μm.

16. The circuit board of claim 15, wherein a width of each of the plurality of traces is 30 μm.

* * * * *